United States Patent [19]

Ouyang

[11] 4,084,175

[45] Apr. 11, 1978

[54] DOUBLE IMPLANTED PLANAR MOS DEVICE WITH V-GROOVE AND PROCESS OF MANUFACTURE THEREOF

[75] Inventor: Paul Hsiung Ouyang, Lake Ronkonkoma, N.Y.

[73] Assignee: Research Corporation, New York, N.Y.

[21] Appl. No.: 728,264

[22] Filed: Sep. 30, 1976

[51] Int. Cl.² .................... H01L 29/78; H01L 27/02; H01L 29/06
[52] U.S. Cl. ........................................ 357/55; 357/23; 357/42
[58] Field of Search .................. 357/23, 55, 42

[56] References Cited

U.S. PATENT DOCUMENTS 3,975,752  8/1976  Nicolay ................. 357/55

FOREIGN PATENT DOCUMENTS 2,441,432  3/1975  Germany ................. 357/55

*Primary Examiner*—Edward J. Wojciechowicz
*Attorney, Agent, or Firm*—Ostrolenk, Faber, Gerb & Soffen

[57] ABSTRACT

An MOS transistor has a short vertical channel extending along the thickness of the transistor wafer and along the wall of a V-shaped groove, and has laterally disposed source, drain and gate electrodes on the same surface of the wafer. The channel is formed by a double ion implantation, or double diffusion operation. The source and drain electrodes are disposed on the same surface of the wafer and on opposite sides of the V-groove. The transistor has the speed capability of a bipolar transistor and high device density of a silicon gate MOS device, and has a shorter channel length (less than 1 micron) and higher punch-through voltage than has been previously available in a planar-MOS device.

11 Claims, 12 Drawing Figures

DOUBLE IMPLANTED PLANAR MOS DEVICE WITH V-GROOVE AND PROCESS OF MANUFACTURE THEREOF

BACKGROUND OF THE INVENTION

This invention relates to MOS-type transistors, and more specifically relates to a novel MOS transistor, hereafter called a VD-MOS transistor which offers advantages over other MOS transistors.

The device of the present invention is particularly useful in the fabrication of large scale integrated (LSI) circuits for various applications. Such LSI circuits commonly employ various types of MOS transistors. Among the recent types of MOS transistors introduced for possible LSI use are the V-MOS and D-MOS transistors which with their applications are described in an article appearing at pages 74 to 81 of ELECTRONICS, April 1, 1976. The V-MOS transistor is also described in U.S. Pat. No. 3,924,265 to T. J. Rodgers.

In the D-MOS device, a double-diffused doping profile is formed in the wafer below the gate region to form a short channel extending along the length of the wafer. Note that a double ion implantation could also be used and it is intended that the term double-diffusion, used hereinafter, includes the double ion implantation process. The D-MOS device is capable of very high device density, much higher than that of the bipolar transistor but the device is not as fast as the bipolar transistor (e.g. 0.5 nsec per gate delay). However, the fabrication of the D-MOS device is complex and hard to control so there is often poor manufacturing yield. A major reason for the poor yield is that the cross-over point in the double diffusion profile of the D-MOS is not accurately controllable so that the threshold voltage can vary greatly.

The V-MOS device is well known, wherein a V-shaped notch is placed in the wafer surface to allow access to a substrate-level MOS source element while the drain and gate structures are formed on the slopes of the notch. This vertical arrangement of the active elements of the device permits a compact arrangement of devices in a wafer, and the technique allows an increase in device density over that of bipolar circuit elements. The major limitation of V-MOS devices is that only the common source configuration is allowed because of the common back of the wafer electrical contact.

In summary, the D-MOS devices have yield and voltage threshold problems while the V-MOS have very limited circuit design applications because of the common back contact.

BRIEF DESCRIPTION AND OBJECTS OF THE PRESENT INVENTION

In accordance with the present invention, a novel MOS transistor is provided which combines the advantages of the D-MOS and V-MOS to produce a high density, high speed MOS transistor, termed a VD-MOS device. Thus the transistor is a lateral transistor like the D-MOS, but a V-groove is used to define a vertical channel length which can be accurately controlled by ion implantation and by available diffusion equipment. The use of the V-groove simplifies the fabrication process and also allows very high device densities. It also allows shorter channel lengths but, in contrast to conventional planar MOS devices, it yields increased punch-through voltages. The device of the invention will usually have an effective channel length of less than one micron.

In a particular transistor made in accordance with the invention, the source and drain are both located adjacent to a single surface of a semiconductor wafer and are separated by a V-groove preferably formed by anisotropic etching of silicon resulting in (1,1,1) oriented surfaces. An appropriately doped channel, terminating on the same surface of the V-groove as the source and whose effective length is determined by a vertical difference of the source and channel doping profiles, is formed in a region underlying and adjacent to a portion of the source region. A gate oxide formed on the V-groove serves to separate the source and drain regions and to support the gate electrode of the device.

A lightly doped region extends around the bottom of the V-groove from the channel region to the drain, and provides a buffer region, or drift region to increase the breakdown voltage. By way of example, the transistor of the present invention can operate with a source-to-drain voltage in excess of 5 volts.

An object of the invention is to provide a MOS structure and the method in which ion-implantation and V-grooving (or double diffusion and V-grooving) are used to precisely control the threshold voltage.

Another object of the invention is to provide a structure and method of the above character in which very short channel lengths (0.1 - 1.0 μm) can be reproducibly realized.

Another object of the invention is to provide a structure and method of the above character in which the double doping profile, which determines the threshold voltage and the channel length, can be easily measured subsequent to each processing step.

Another object of the invention is to provide a planar structure and method of the above character in which both the source and drain as well as the gate are on one side of the wafer.

It is another object of this invention to provide structure and method of the above character to improve the self-aligning characteristics of the gate.

It is another object of the invention to provide a structure and a method of the above character which makes possible packing densities as high as those obtained with silicon gate MOS devices.

Another object of the invention is to provide a structure and method of the above character in which all devices are electrically isolated to prevent unintended current leakage.

It is another object of the invention to provide a structure and a method of the above character which makes it possible to manufacture the structure more economically and easily.

DETAILED DESCRIPTION OF THE DRAWINGS

Figure 1:
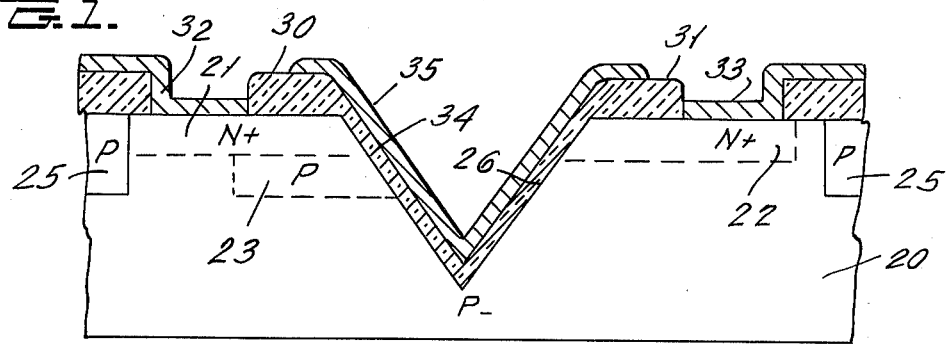
FIG. 1 is a schematic cross-sectional view through a VD-MOS device made in accordance with the invention, and is a cross-section of FIG. 2 taken across section 1—1 in FIG. 2.
Figure 2:
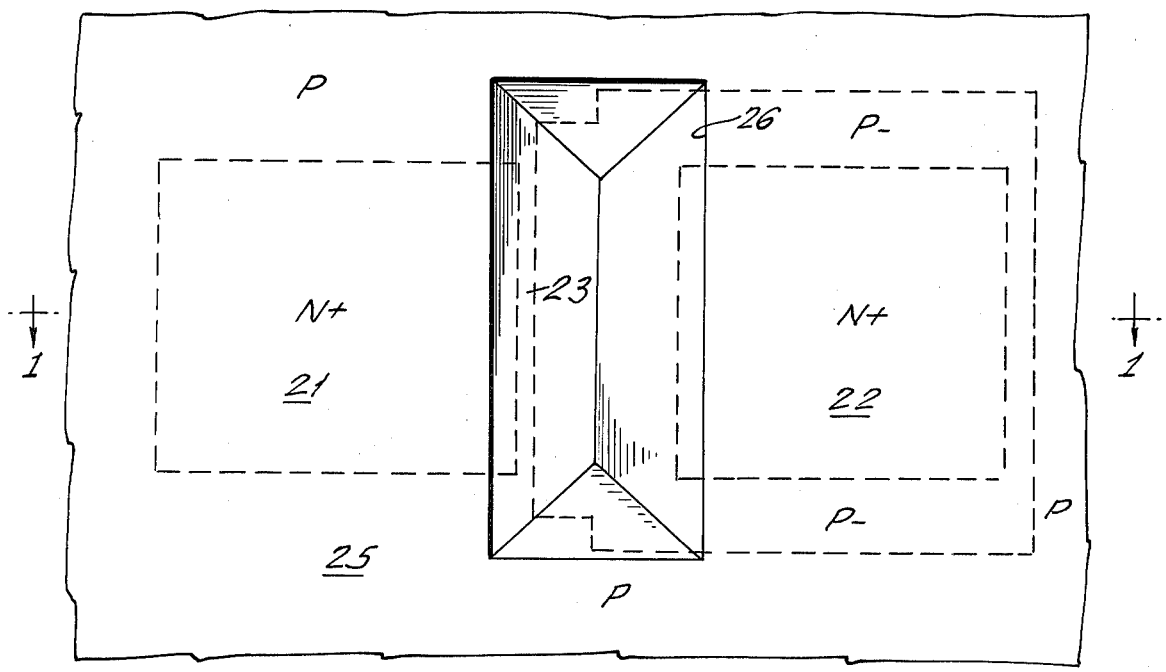
FIG. 2 is a schematic top plan view of the device of FIG. 1 to illustrate the shape of the V-groove and of the junctions in the wafer.
Figure 3:
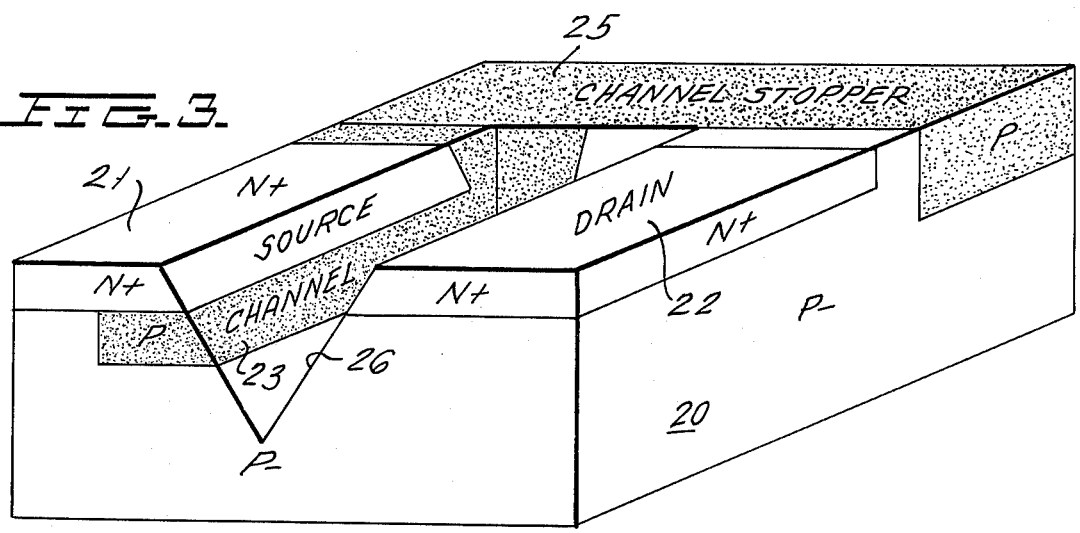
FIG. 3 is a schematic perspective cut-away view of the novel transistor of FIGS. 1 and 2.

Referring first to FIGS. 1, 2 and 3, there is illustrated one embodiment of a single transistor made in accordance with the invention, where the device shown is but one of a large number of devices within a common wafer. Greater detail about the device, and about the process for its manufacture, will be given hereinafter. It will be apparent that the device dimensions have been exaggerated for purposes of clarity, and that cross-hatching has been eliminated from the bulk of the silicon wafer body for purposes of clarity.

Referring now to FIGS. 1, 2 and 3, the transistor shown is formed in a silicon wafer having a lightly doped P− body 20. The P− body 20 has N+ source and drain regions 21 and 22 therein, formed by any desired process, and also has a P region 23, which forms a vertical channel for the device, as will be later described. The P region extends beyond the channel to channel stopper regions 25 which isolate the transistor from adjacent elements in the wafer 20.

A V-shaped groove 26 is then etched into the upper surface of wafer 12, to separate N+ regions 21 and 22, and to terminate P channel 23. Relatively thick insulation oxide coatings 30 and 31 cover the source and drain regions 21 and 22, respectively (FIG. 1) and have windows therein for reception of source and drain electrodes 32 and 33, respectively. A relatively thin oxide coating 34 is formed in the groove 26, and receives, on top thereof, gate electrode 35.

The threshold voltage $V_T$ of a VD-MOS can be expressed by $$V_T = (4\epsilon_s q N_{Amax} \phi_f)^{1/2}/C_{ox} + 2\phi_f + V_{FB} \qquad (1)$$

where $N_{Amax}$ is the maximum concentration in the channel. Since $C_{ox}$ and $V_{FB}$ can be controlled to a few percent variation due to process variations, the control of $V_T$ therefore depends directly on the control of $N_{Amax}$.

Figure 3A:
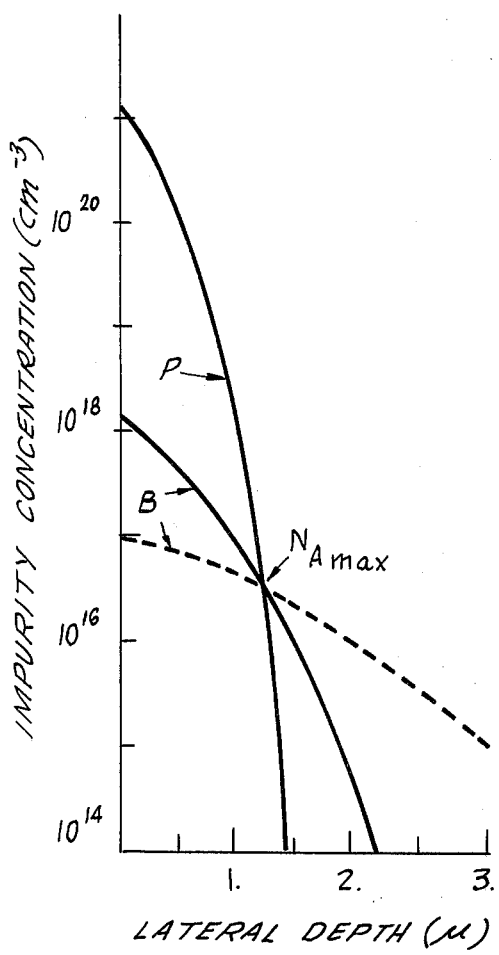
FIGS. 3a and 3b show typical profiles for an implanted device.
Figure 3B:
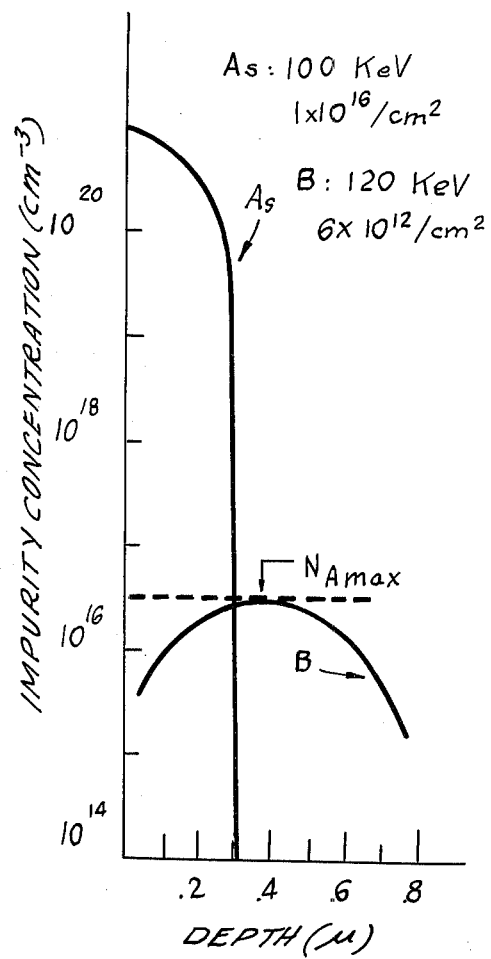

Since the channel and source are vertically formed, ion implantation can be used to fabricate both the source and channel doping profiles. Since ion implantation is capable of controlling precisely (±1%) the dopant depth distribution and dosage, $N_{Amax}$ and channel lengths can be precisely controlled. FIGS. 3a and 3b show typical implanted profiles for an implanted device where the peak of the channel profile $N_{Amax}$ lies beneath the source junction. Any variations in the subsequent processing steps, e.g. annealing, gate oxidation, etc. will not affect $N_{Amax}$ significantly resulting in excellent threshold voltage control.

Since $N_{Amax}$ is determined by ion-implantation, a wide range of $V_T$ can be realized. In particular, low i $V_T$ (e.g. 0.5 volt) can be realized for low power dissipation. Likewise, using ion implantation, very short channel lengths can be obtained reproducibly.

The vertical channel also allows on-process measurement of the doping profile by using, after each process step, the differential capacitance method or angle lapping and staining. The drain-gate overlap capacitance is determined by the intersection of region 22 and region 34 which is typically a very small area (e.g. 0.2 μm times the channel width). Thus the device is self-aligned because of the small overlap. This will increase switching speed and allows very high packing density. The P guard ring region 25 for device isolation can be obtained by an unmasked boron implantation or by using the same mask for forming the channel, thus requiring no extra masking step. The V-shaped gate also increases the punch-through voltage, because the drain depletion layer will mainly extend towards the substrate, and only a small portion of the drain depletion layer will extend towards the source. The presence of the P region 20 and the V-gate will also reduce the so-called "short channel effect" i.e. $V_T$ dependence on the drain voltage.

Since both the source 21 and the drain 22 are on the same face of the wafer, i.e. a planar structure, great design flexibility results e.g. VD-MOS or other MOS structure can be used as load devices, and NOR gates and NAND gates can be implemented. This is in contrast to the well-known vertical V-MOS where resistors are required for load devices, and only NOR gates can be built because all the V-MOS sources are required to be commonly grounded.

For an electrical circuit, a lateral depletion V-MOS can be used as the load device for a VD-MOS with no additional fabrication steps. The V-shaped gate of a lateral V-MOS results in a higher punch-through voltage than its conventional MOS counterpart. Thus for a given punch-through voltage, shorter channel length or lower substrate doping concentration can be used resulting in either smaller load capacitance or smaller source-to-substrate bias sensitivity.

Figure 9:
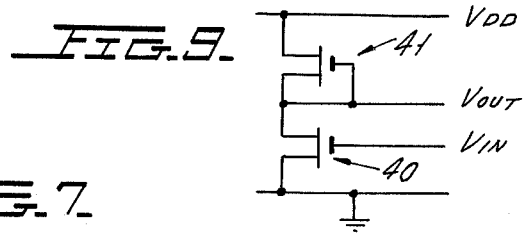
FIG. 9 is a circuit diagram of the inverter made by the process of FIGS. 4 to 8.
Figure 7:
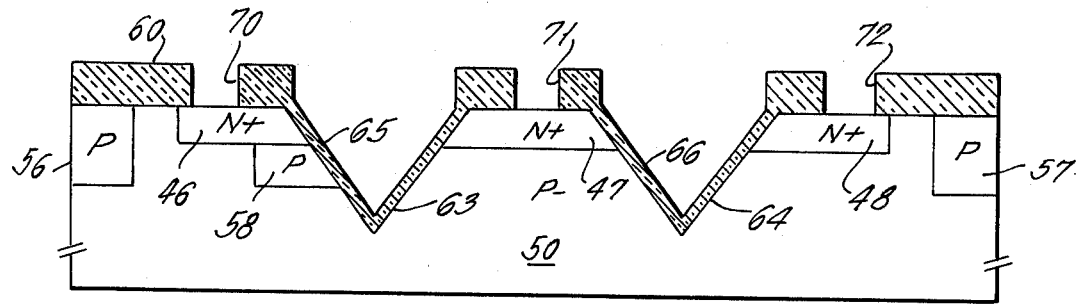

FIGS. 4 to 8 schematically illustrate the sequential steps used in forming the inverter circuit of FIG. 9. The inverter of FIG. 9 employs the novel VD-MOS transistor 40 as a drive, and a depletion mode V-MOS transistor 41 as a load.

The process for forming the circuit uses only five masking steps, with the channel stopper for device isolation being formed without a separate step. The process employs a combination of a self-aligned gate process and V-grooving process. The self-aligned gate process keeps the gate-to-source and gate-to-drain overlapping capacitances small. This overlapping is determined by the source and drain depth, and can be made less than 0.2 microns when using ion implantation techniques.

Figure 4:
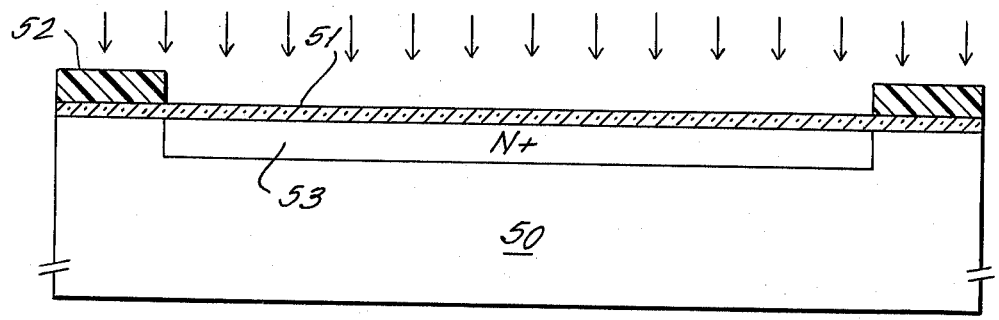
FIGS. 4 to 8 illustrate sequential steps in the fabrication of an inverter circuit using the transistor of the present invention.

The process starts in FIG. 4 with a low doped P-type silicon wafer 50 with (1,0,0) crystal orientation. The low doping level results in low parasitic capacitances between source and drain to the substrate, and a low total gate capacitance. It also reduces the variation in threshold voltage due to substrate-to-source biasing.

When using ion implantation, the wafer 50 is cleaned and oxidized to have an oxide layer 51 grown on its upper surface to a thickness of about 500A to 1000A as shown in FIG. 4 to prevent possible channelling of ions during implantation. A first photoresist mask 52 is then formed on oxide layer 51, to serve as a mask for the formation of N+ region 53. The photolithographic alignment tolerance in forming mask 52 and subsequent masks is not critical. The N+ region 53 is then formed through the mask 53 using any suitable dopant ion, such as arsenic or phosphorous.

The mask 52 is then removed, and a second photoresist mask 55 (FIG. 5) is formed on oxide 51. A boron implantation is then carried out through mask 55 to form the P-type channel stopper regions 56 and 57 and the P-type channel region 58. Two boron implantations with mask 55 may be required; a shallow implantation whose peak is just below the silicon-silicon dioxide surface to serve as a channel stopper; and a low dose deep implantation whose peak is below the source junction to form P-region 58.

Figure 6:
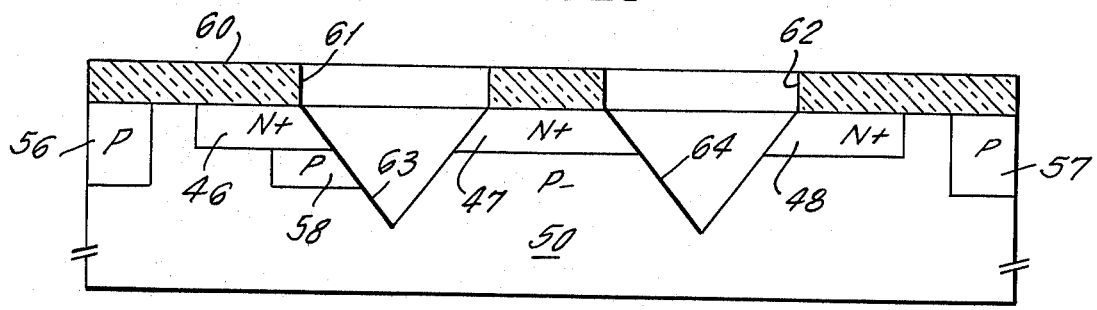

Photoresist 55 is then removed and a 5000A thick silicon dioxide layer 60 (FIG. 6) is deposited on the wafer in a third masking step carried out to open windows 61 and 62 in oxide 60 which are elongated along the (1,1,0) crystal direction in the conventional way. V-shaped grooves 63 and 64 are then etched in the wafer as shown in FIG. 6. The alignment tolerance of the gate relative to region 58 is noncritical and can be as large as half of the gate opening, because region 58 will always be exposed by the V-groove. The N+ region 53 is exposed and divided by the V-grooves 63 and 64 to form regions 46, 47 and 48. Regions 46 and 47 provide the source and the drain for VD-MOS 40, while regions 47 and 48 provide the source and drain for V-MOS 41. A portion of region 58 is also exposed by the V-groove 63 forming the effective channel of the VD-MOS 40.

The V-grooves 63 and 64 are formed by anisotropic etching of the (1,0,0) silicon. This can be done using hydrazine buffered in water heated to 100° C. This will etch the (1,0,0) direction at a much higher rate than the (1,1,1). Thus, when windows 63 and 64 are opened carefully along the (1,1,0) direction, the self-stopping grooves 63 and 64 will be formed with a depth determined by the window opening. At the bottom of the V-groove, the groove walls will form an angle of 70°. The oxide overhanging the V-groove due to etch undercutting is suitably removed.

Thin oxide layers 65 and 66 about 1000A thick are then grown over the walls of grooves 63 and 64, respectively, and layers of about 50 to 70A thick phosphosilicate glass are deposited by chemical vapor deposition on the grooves for stabilization.

The wafer of FIG. 7 is again masked, and windows 70, 71 and 72 are formed through oxide 60. The above mask is then removed, and metallization is then applied through a fifth mask as shown in FIG. 8 to form the ground electrode 73, inverter input electrode 74, inverter output electrode 75, and the power supply electrode 76.

Figure 8:
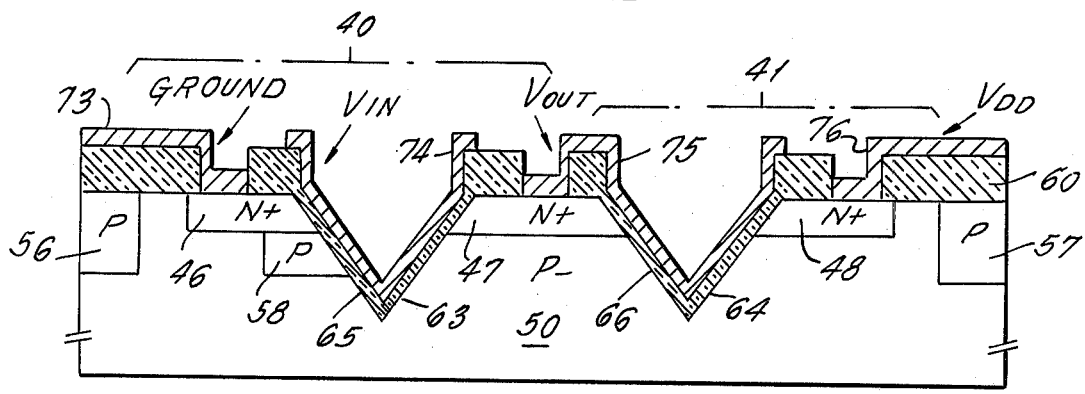

Clearly, the VD-MOS transistor on the left of FIG. 8 is the same as the transistor of FIGS. 1, 2 and 3, and will have all of the advantages set forth in reference to FIGS. 1, 2 and 3. Note further that the same process steps described above would be used to fabricate the VD-MOS alone or in combination with other integral components.

Figure 5:
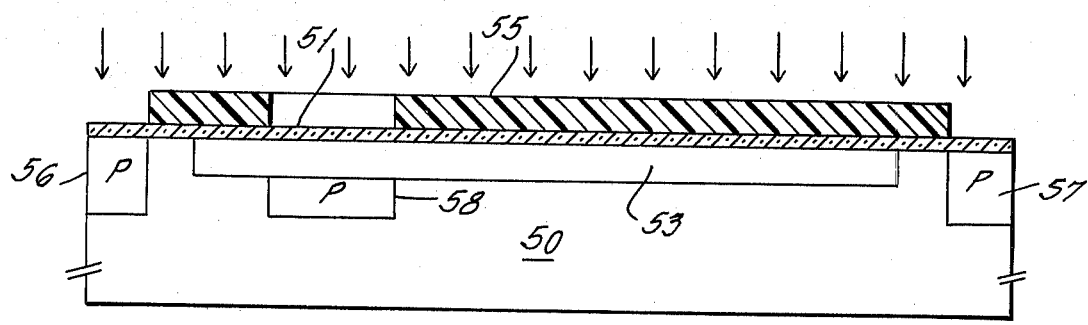

The device of FIGS. 8 and 9 could also have been made with a diffusion, rather than ion implantation process. When using a diffusion technique, the substrate 50 of FIG. 4 would first receive a 6000A thick oxide layer. A first mask would then provide windows in the oxide layer to allow an initial boron diffusion for forming regions 56 to 58 (FIG. 5). Thereafter, a second mask would be formed to allow a phosphorous diffusion to form N+ region 53. Thereafter, the steps of FIGS. 6, 7 and 8, described above, are repeated.

When using the ion implantation technique, special care should be taken with the metallizing step since the N+ regions 53 are very thin (only a few tenths of a micron). molybdenum-gold metallization can be used, in the known manner.

Figure 10:
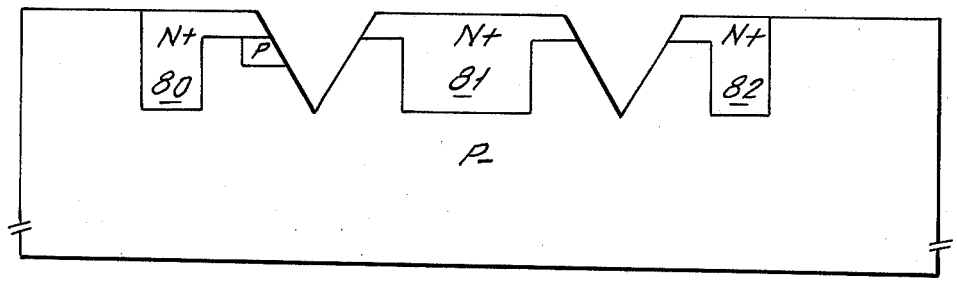
FIG. 10 is a schematic cross-section of a wafer having a modified junction profile from that shown in FIG. 6.

This shortcoming is overcome when using the junction pattern shown in FIG. 10. In FIG. 10, the N+ diffusion regions 80, 81 and 82 (equivalent to regions 46, 47 and 48, respectively, in FIG. 8) are selectively formed below the areas where drain and source contacts for the V-MOS and VD-MOS will be later opened. This then allows the use of aluminium metallization without the danger of shorting during the alloy step.

The above processes for forming the device of FIGS. 1, 2, 3, 8 and 9 are typical only, and a wide range of known processes could also be used, as will be apparent to those skilled in the art.

Although a preferred embodiment of this invention has been described, many variations and modifications will now be apparent to those skilled in the art, and it is therefore preferred that the instant invention be limited not by the specific disclosure herein but only by the appended claims.

The embodiments of the invention in which an exclusive property on privilege is claimed are defined as follows:

1. A semiconductor device, comprising:
a semiconductor wafer containing a first concentration of impurities of a first conductive type;
first and second spaced regions adjacent one surface of said semiconductor wafer, each of said first and second spaced regions containing a concentration of impurities of a second conductive type;
a V-groove extending from said one surface of said semiconductor wafer intermediate said first and second spaced regions, each of said first and second spaced regions terminating at an opposite surface of said V-groove;
first and second substantially co-planar electrode means connected to said first and second spaced regions respectively, and third electrode means disposed within said V-groove; each of said first, second and third electrode means being insulated from one another;
a third region underlying and adjacent to a portion of said first spaced regions and terminating on one side of said V-groove and extending for only a portion of the depth of said V-groove, said third region containing a higher concentration of impurities of said first conductive type than said first concentration, the side of said V-groove opposite to said one side having impurities of said first conductivity type at said first concentration along its full depth.

2. A semiconductor device in accordance with claim 1, including a thin gate oxide on said V-groove; said third electrode means being deposited atop said thin gate oxide and insulated from said semiconductor wafer by said thin gate oxide.

3. A semiconductor device in accordance with claim 1, wherein the surfaces of said V-groove are both oriented on (1,1,1) planes of said semiconductor wafer.

4. A semiconductor device in accordance with claim 1, wherein said V-groove is formed by anisotropic etching.

5. A semiconductor wafer as claimed in claim 1, wherein said semiconductor wafer has (1,0,0) crystal orientation and wherein said V-groove is formed by anisotropic etching to form (1,1,1) oriented surfaces.

6. A semiconductor device in accordance with claim 1, wherein the vertical length of said third region is 0.15 - 1 $\mu$m.

7. A VD-MOS lateral transistor, comprising:
a semiconductor wafer containing a first concentration of P-type impurities;
source and drain regions adjacent one surface of said semiconductor wafer, each of said source and drain regions containing a concentration of N-type impurities;
a V-groove extending from said one surface of said semiconductor wafer intermediate said source and drain regions, each of said source and drain regions terminating on a different (1,1,1) oriented surface of said V-groove;
a single channel region underlying and adjacent to a portion of said source region and terminating on the same surface of said V-groove as said source region, said single channel region containing a higher concenration of P-type impurities than said first concentration, the surface of said V-groove extending from said drain region having said first concentration along its full length.

8. A semiconductor device in accordance with claim 7, including a thin gate oxide on said V-groove.

9. A semiconductor device in accordance with claim 8, including a gate insulated from said semiconductor wafer by said thin gate oxide.

10. A semiconductor device in accordance with claim 7, wherein the vertical height of said channel is 0.15 - 1 $\mu$m.

11. A semiconductor device in accordance with claim 7 wherein said V-groove is formed by anisotropic etching.

* * * * *